(12) United States Patent
Ishimaru et al.

(10) Patent No.: US 7,087,844 B2
(45) Date of Patent: Aug. 8, 2006

(54) WIRING CIRCUIT BOARD

(75) Inventors: Yasuto Ishimaru, Ibaraki (JP); Kensuke Nishi, Ibaraki (JP); Hiroshi Yamazaki, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 0 days.

(21) Appl. No.: 11/014,399

(22) Filed: Dec. 16, 2004

(65) Prior Publication Data

US 2005/0139371 A1    Jun. 30, 2005

(30) Foreign Application Priority Data

Dec. 16, 2003  (JP)  ............................. 2003-418161

(51) Int. Cl.
*H05K 1/00* (2006.01)

(52) U.S. Cl. .................................... 174/250
(58) Field of Classification Search ............... 174/260, 174/250

See application file for complete search history.

(56) References Cited

U.S. PATENT DOCUMENTS

| | | | |
|---|---|---|---|
| 6,259,608 B1 * | 7/2001 | Berardinelli et al. | ........ 361/777 |
| 6,469,260 B1 * | 10/2002 | Horiuchi et al. | ............ 174/262 |
| 2005/0139387 A1 * | 6/2005 | Nishi et al. | .................. 174/260 |

FOREIGN PATENT DOCUMENTS

| | | | |
|---|---|---|---|
| JP | 57-199228 A | | 12/1982 |
| JP | 59-080957 A | | 5/1984 |
| JP | 02-042737 A | | 2/1990 |
| JP | 04-243156 | * | 8/1992 |
| JP | 04-243156 A | | 8/1992 |
| JP | 10-125717 | * | 5/1998 |
| JP | 10-125717 A | | 5/1998 |
| JP | 11-297759 A | | 10/1999 |

* cited by examiner

*Primary Examiner*—Randy W. Gibson
*Assistant Examiner*—Yuriy Semenenko
(74) *Attorney, Agent, or Firm*—Leydig, Voit & Mayer, Ltd.

(57) ABSTRACT

The width of a particular part (A) of a strip conductor 2 of a wiring circuit board for mounting is reduced, wherein the strip conductor is exposed to form a stripe pattern, so that individual conductor can be connected to electrode E of an electronic component. The particular part (A) is one section in the longitudinal direction of a strip conductor having a long end, which part includes an area overlapping an electrode which is connected to a short end and transferred in parallel in the strip width direction up to the position on the strip conductor having a long end. Due to this constitution, a structure capable of suppressing a short circuit between an electrode and a wiring pattern can be afforded to a wiring circuit board, even to an electronic component having an electrode formed in high-density and in a zigzag arrangement pattern, which comprises an area overlapping an electrode.

8 Claims, 9 Drawing Sheets

WIRING CIRCUIT BOARD

FIELD OF THE INVENTION

The present invention relates to a wiring circuit board having a terminal to be directly connected to an electrode of an electronic component such as a semiconductor element and the like so as to mount the electronic component.

BACKGROUND OF THE INVENTION

Semiconductor elements such as IC and the like are generally formed in a great number on a wafer, diced into individual chips and connected to various circuit boards for use. By further integration of IC at a large scale, the number of electrodes formed on the connection surface of one chip is increasing, and therefore, the size of each individual electrode becomes smaller and the arrangement of electrodes becomes congested.

To deal with the steep increase in the number of electrodes in recent years, electrodes are formed on the outer periphery of the connection surface of a chip 100 in an alternate arrangement pattern following zigzag peaks, as shown in FIG. 7(a).

The "alternate arrangement pattern following zigzag peaks" means a pattern wherein, as shown in FIG. 7(b), individual electrodes E (E1, E2) are located on each vertex point J1, J2 of a zigzag line (sawtooth waveform line) J shown with a dashed line. This arrangement pattern depicts a checker pattern in two rows as a whole, as shown in FIG. 7(a).

In the following, this arrangement pattern is also referred to as a "zigzag arrangement pattern".

The amplitude t2 (FIG. 7(a)) of the zigzag line in the zigzag arrangement pattern is determined in consideration of the size of electrodes, such that, as shown in FIG. 7(b), electrodes E1 located on one vertex point J1 do not contact electrodes E2 located on the other vertex point J2, even when transferred in the x-direction in the Figure.

The period (pitch) t1 of the zigzag line can be a short period, such that electrodes E1 located on one vertex point J1 come into contact with electrodes E2 located on the other vertex point J2 when they are transferred in the y-direction in the Figure, if the amplitude of the aforementioned zigzag line is determined with a sufficient room. The zigzag arrangement pattern is advantageous in that it permits setting of a short period.

The zigzag arrangement pattern of electrodes is used together with the stripe pattern of the wiring circuit board to be mentioned later, and enables fine pitch arrangement of electrodes and connection with the outside (e.g., JP-A-2003-249592).

On the other hand, as a technique for directly mounting a semiconductor element, a conductor part of a wiring circuit board is formed in a pattern corresponding to the positions of electrodes of a chip to afford mounting (bare chip mounting), directly connecting a chip with a wiring circuit board.

Figure 8:
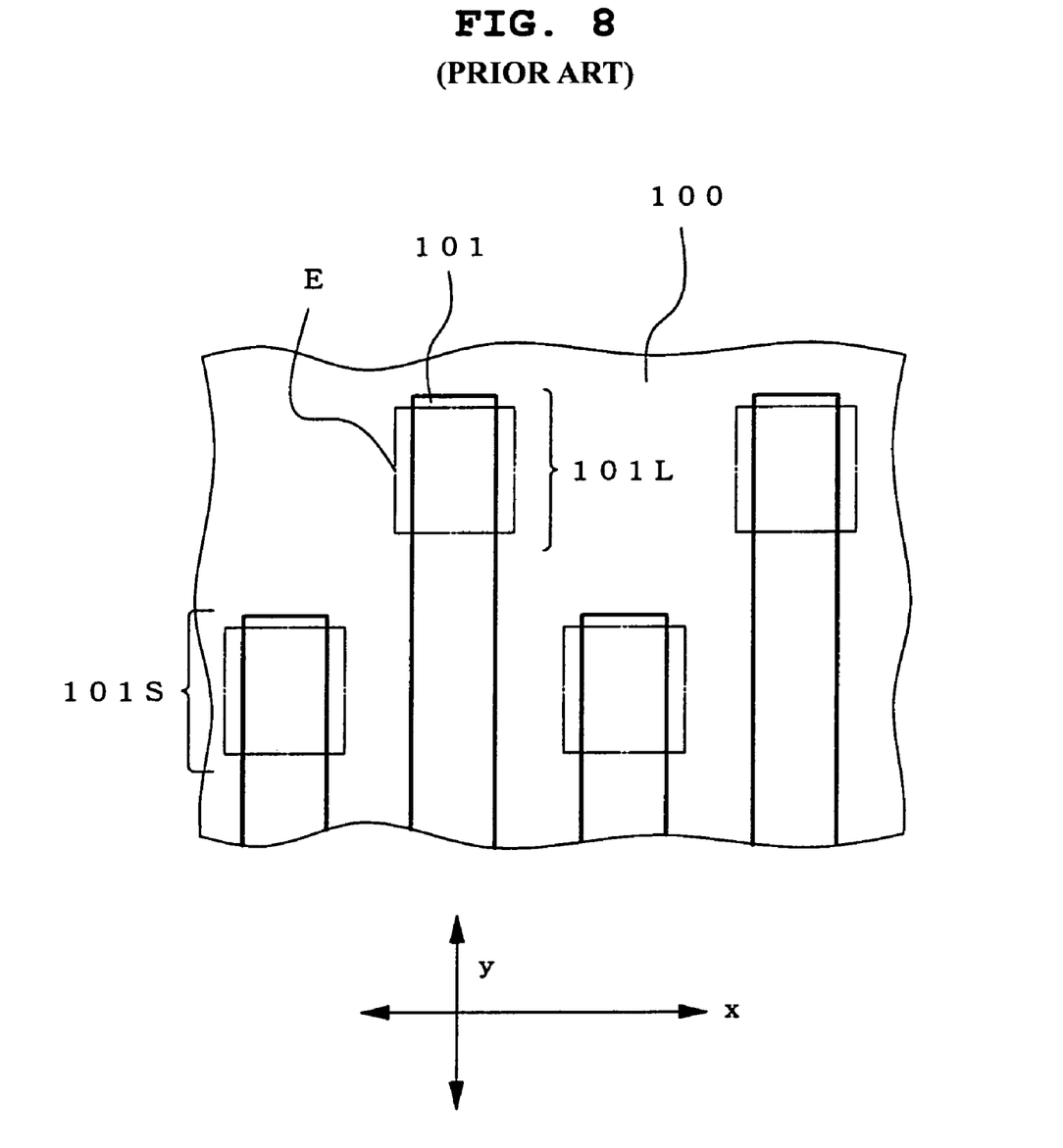
FIG. 8 shows a strip conductor in a stripe pattern corresponding to an electrode in a zigzag arrangement pattern of a conventional wiring circuit board.

The wiring circuit board to be used for the bare chip mounting has a structure, as shown in FIG. 8 as a topically enlarged embodiment, wherein a band-like conductor pattern 101 is formed on an insulating substrate 100. In the wiring circuit board, a strip conductor 101 is formed in exposure to make a stripe pattern in an area corresponding to electrodes E and involved in electrical connection with the electrodes when a chip is set, thereby allowing connection of conductors with respective electrodes (dashed line) E. In this stripe pattern, individual strip conductors 101 extend in the direction (direction shown with an arrow y in the Figure) about perpendicular to the advancing direction of the zigzag arrangement pattern of electrodes E (direction shown with an arrow x in the Figure).

Each strip conductor 101 becomes an end at the position corresponding to respective electrodes E, whereby the end of a stripe pattern contains long ends 101L and short ends 101S alternately arranged therein (e.g., FIGS. 1, 2 of JP-A-2003-249592 and the like).

The edge of the end of each strip conductor often ends slightly extending from electrodes E to be connected, as shown in FIG. 8.

Figure 9:
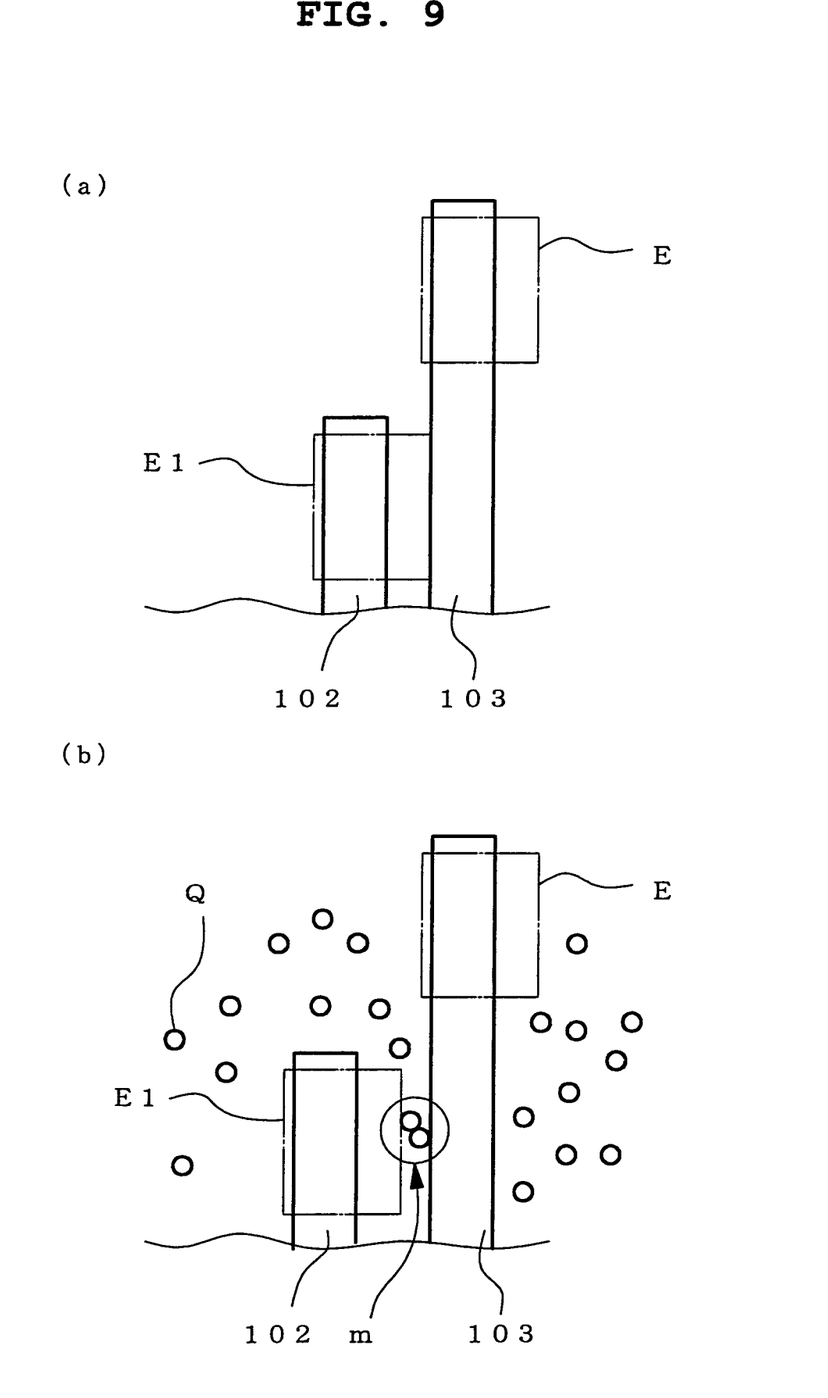
FIG. 9 shows a short circuit between an electrode and a strip conductor in chip mounting.

However, the present inventors investigated in detail the connection between an electrode formed in the above-mentioned zigzag arrangement pattern and a strip conductor formed in a stripe pattern, and found that, as shown in FIG. 9(a), positioning for mounting, and sizes of respective parts such as electrode width, conductor width and the like are required to have high precision, because electrodes E1 bridge to short-circuit two strip conductors 102 and 103 if the mounting position of a chip is deviated even a bit, making manufacture difficult.

In addition, it has been found that, when an anisotropic conductive adhesive comprising a conductive particle Q dispersed in a base material is used for connecting a chip with a wiring circuit board, as shown in FIG. 9(b), a conductive particle Q can be a short circuit path between an electrode E1 and a strip conductor 103, as shown by m in the Figure.

It is therefore an object of the present invention to provide a wiring circuit board having a structure capable of solving the above-mentioned problems, and to impart a wiring circuit board with a structure capable of suppressing a short circuit between an electrode and a wiring pattern even in the case of an electronic component having electrodes formed in high density and in a zigzag arrangement pattern.

SUMMARY OF THE INVENTION

The present invention has the following characteristics.

(1) A wiring circuit board for mounting an electronic component, which is characterized in that an electronic component is to be mounted, which comprises plural electrodes formed on a connection surface thereof in an alternate arrangement pattern following zigzag peaks;

the wiring circuit board comprises a strip conductor formed in exposure and extending in a direction about perpendicular to an advancing direction of said zigzag, in a stripe pattern, so that an individual conductor can be connected to each electrode of an electronic component;

each strip conductor-forms an end at a position corresponding to each electrode, thus the ends of the stripe pattern being formed by alternately arranged long ends and short ends; and the strip conductor having a long end part comprises the following part (A) having a smaller width than the width of parts adjacent to both ends of the part (A):

(A) one section in the longitudinal direction of a strip conductor having a long end, which section comprises an area overlapping an electrode which is connected to a short end and transferred in parallel in the strip width direction up to the position on said strip conductor having a long end.

(2) The wiring circuit board of the above-mentioned (1), wherein the above-mentioned part (A) has the same width for the whole and the width becomes smaller at the boundary between the part (A) and the adjacent part to form a step.

(3) The wiring circuit board of the above-mentioned (1), wherein the above-mentioned part (A) comprises a part having a gradually decreasing width from both ends toward the center.

(4) The wiring circuit board of the above-mentioned (3), wherein the above-mentioned part (A) has a width gradually decreasing from both ends toward the center where it becomes the smallest, such that outline(s) of side edge(s) form(s) an incurved circular arc.

(5) The wiring circuit board of the above-mentioned (1), wherein the electronic component to be mounted is a bare chip of a semiconductor element having a quadrate shape, and electrodes are formed in an alternate arrangement pattern following zigzag peaks on the outer periphery area of a connection surface of said bare chip.

(6) The wiring circuit board of the above-mentioned (5), wherein, when a bare chip is mounted on the wiring circuit board, a strip conductor pattern is formed on the outside of an area occupied by said bare chip, and an end of each strip conductor enters said occupied area and ends facing the center of said occupied area.

(7) The wiring circuit board of the above-mentioned (5), wherein, when a bare chip is mounted on said wiring circuit board, a strip conductor pattern is formed in the center of an area occupied by said bare chip, and each strip conductor ends at the periphery of said occupied area facing toward the outside of the area.

(8) The wiring circuit board of the above-mentioned (1), wherein each strip conductor formed to make a stripe pattern has a strip width of 5 μm–70 μm and a pitch of 20 μm–100 μm.

BRIEF DESCRIPTION OF THE DRAWINGS

FIG. 2 is a schematic showing of one embodiment of the wiring circuit board of the present invention, showing a wider range than FIG. 1, wherein FIG. 2(a) shows a substrate plane and FIG. 2(b) is a sectional view along X—X of FIG. 2(a).

In each Figure, the symbols indicate as follows: 1; insulating substrate, 2; strip conductor, L; long end, S; short end, E; electrode of chip, W1; width of (A) above.

DETAILED DESCRIPTION OF THE INVENTION

Figure 1:
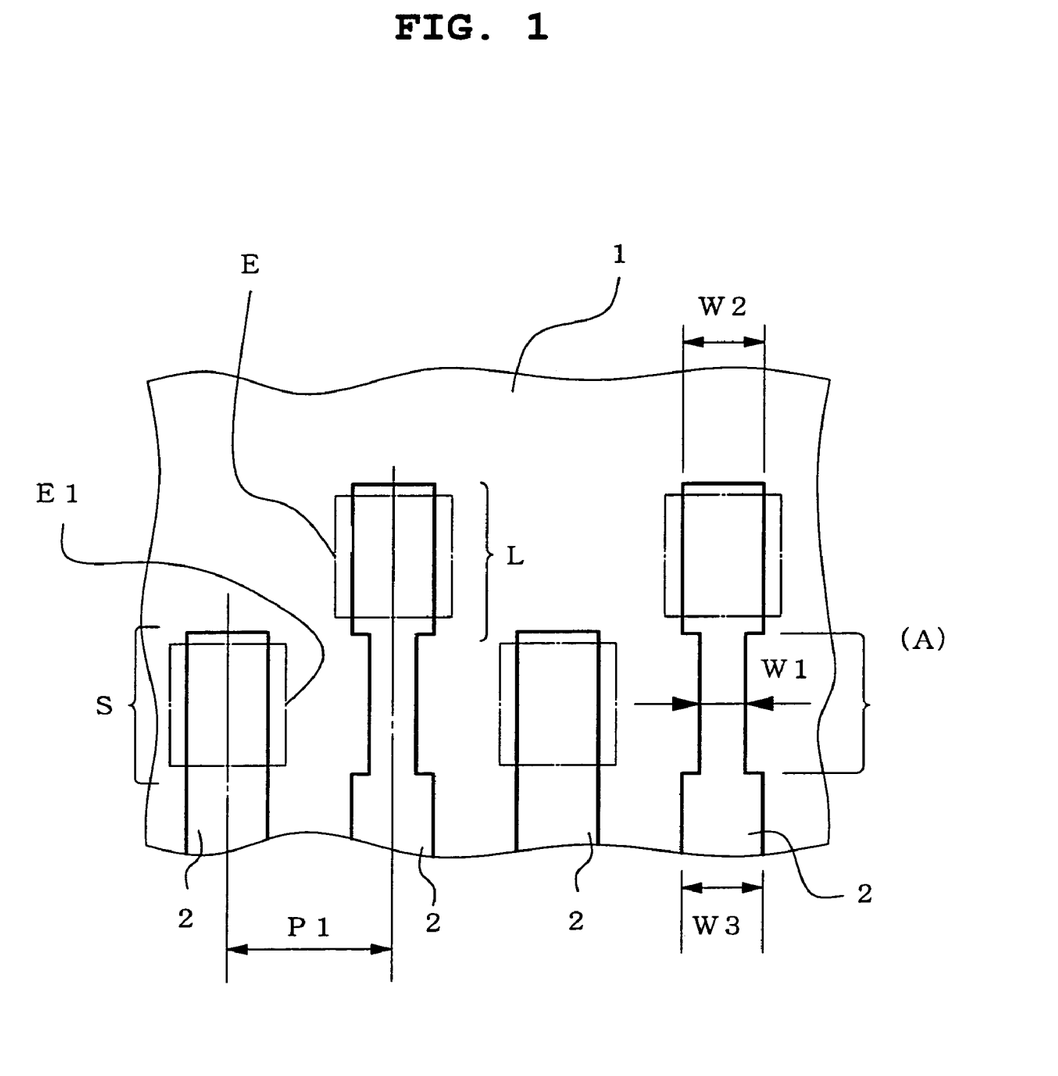
FIG. 1 is an enlarged view of a concerned part schematically showing one embodiment of the wiring circuit board of the present invention.

As shown in the embodiment of FIG. 1, the inventive wiring circuit board for mounting, which has an alternate pattern of long end part L and short end part S, is characterized in that the above-mentioned part (A) has a smaller width than that of the adjacent parts to the both ends of this part.

For the avoidance of contact of an electrode (particularly, one connected to a short end part) with the adjacent strip conductor due to the positioning deviation during chip mounting, if the width of a strip conductor is simply made narrower over the entire length, the gap between strip conductors is widened but the contact area between a strip conductor and an electrode becomes small, thus reducing the connection reliability. Particularly, when an anisotropic conductive film is disposed between a strip conductor and an electrode and the width of the strip conductor is smaller, the number of conductive paths and conductive particles capable of attending the electric connection decreases, which in turn leads to remarkably degraded connection reliability.

In addition, when the width of the strip conductor is simply reduced over the entire length, the strip conductor comes to be easily peeled off from the insulating substrate. For example, spray washing in the production step of a wiring circuit board may cause exfoliation of the strip conductor.

Figure 2:
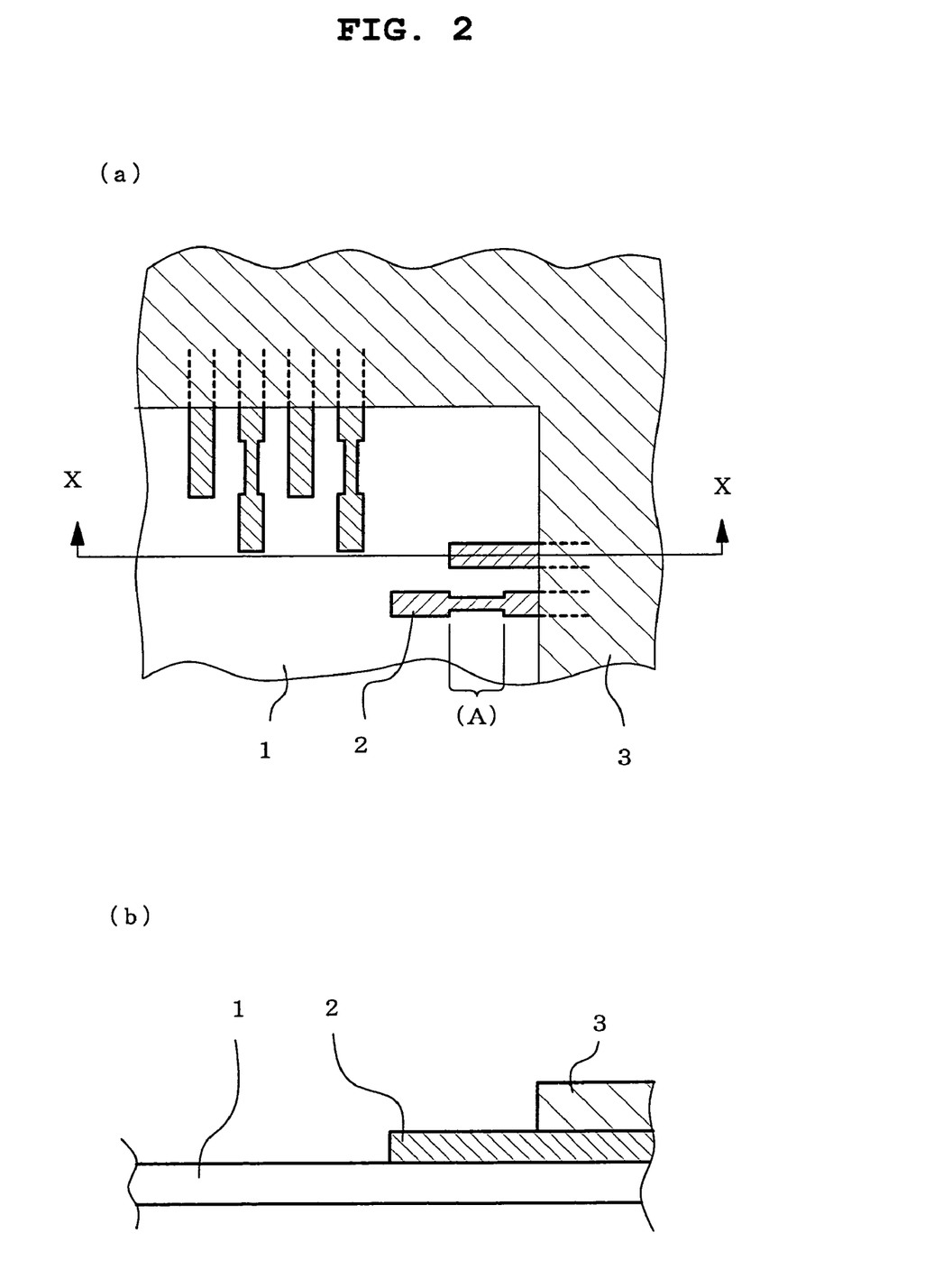

The present inventors examined exfoliation of the strip conductor and found that it tends to occur from the tip of the strip conductor, and that widening only the tip as in the embodiment of JP-A-2003-249592, FIGS. 1, 2 to have a long and narrow extending part results in easy exfoliation of the tip as well as the middle portion.

In the present invention, since the width of the strip conductor is narrowed only in the middle portion of the part (A), a short circuit due to a contact of an electrode (particularly one connected to a short end part) with an adjacent strip conductor having a long end due to the occurrence of deviation during chip mounting can be suppressed.

In addition, since the contact part between a strip conductor and an electrode has the original width, the connection reliability is maintained. Moreover, the full length of the part (A) is as short as about the size of an electrode, and supported by the original wide strip conductor at both ends of the part, exfoliation in the part (A) does not occur easily.

The wiring circuit board of the present invention is explained in detail by referring to a specific structure.

As shown in FIG. 1, one example of the structure of the wiring circuit board has a basic structure having a strip conductor 2 formed on an insulating substrate 1. This basic structure is the same as in the above-mentioned "BACKGROUND OF THE INVENTION" by referring to FIG. 8. An electronic component to be mounted on said wiring circuit board is the same as in FIG. 7 and has plural electrodes formed in a zigzag arrangement pattern on its connection surface.

The wiring circuit board includes an exposed strip conductor 2 extending in a direction about perpendicular to an advancing direction of the aforementioned zigzag to make a stripe pattern, so that an individual conductor can be connected to each electrode E. Each strip conductor 2 forms an end of a position corresponding to each electrode E, thus making long ends L and short ends S alternately arranged to form the stripe pattern.

In contrast to the above-mentioned basic structure of wiring circuit boards, in the present invention, a width W1 of part (A) is smaller than the widths W2, W3 of the strip conductors adjacent in the longitudinal direction, as shown in FIG. 1. In the embodiment of FIG. 1, the width W1 of part (A) is made smaller to form a step at the boundary between the part (A) and the adjacent part.

By such constitution reducing the width of part (A), the above-mentioned invention provides an effect in that a slight deviation in positioning during mounting does not permit easy contact of an electrode E1 connected to a short end S with a strip conductor 2 having a long end part L.

As the electronic component to be mounted on the wiring circuit board, one having electrodes arranged in a fine pitch, high-density and in a zigzag arrangement pattern is suitable. Representative examples thereof include a bare chip of an integrated circuit such as IC, LSI and the like.

A typical bare chip generally has a quadrate shape for the outer periphery of a chip, and the size of one side is, though not limited to, generally about 0.5 mm–30 mm.

Figure 7:
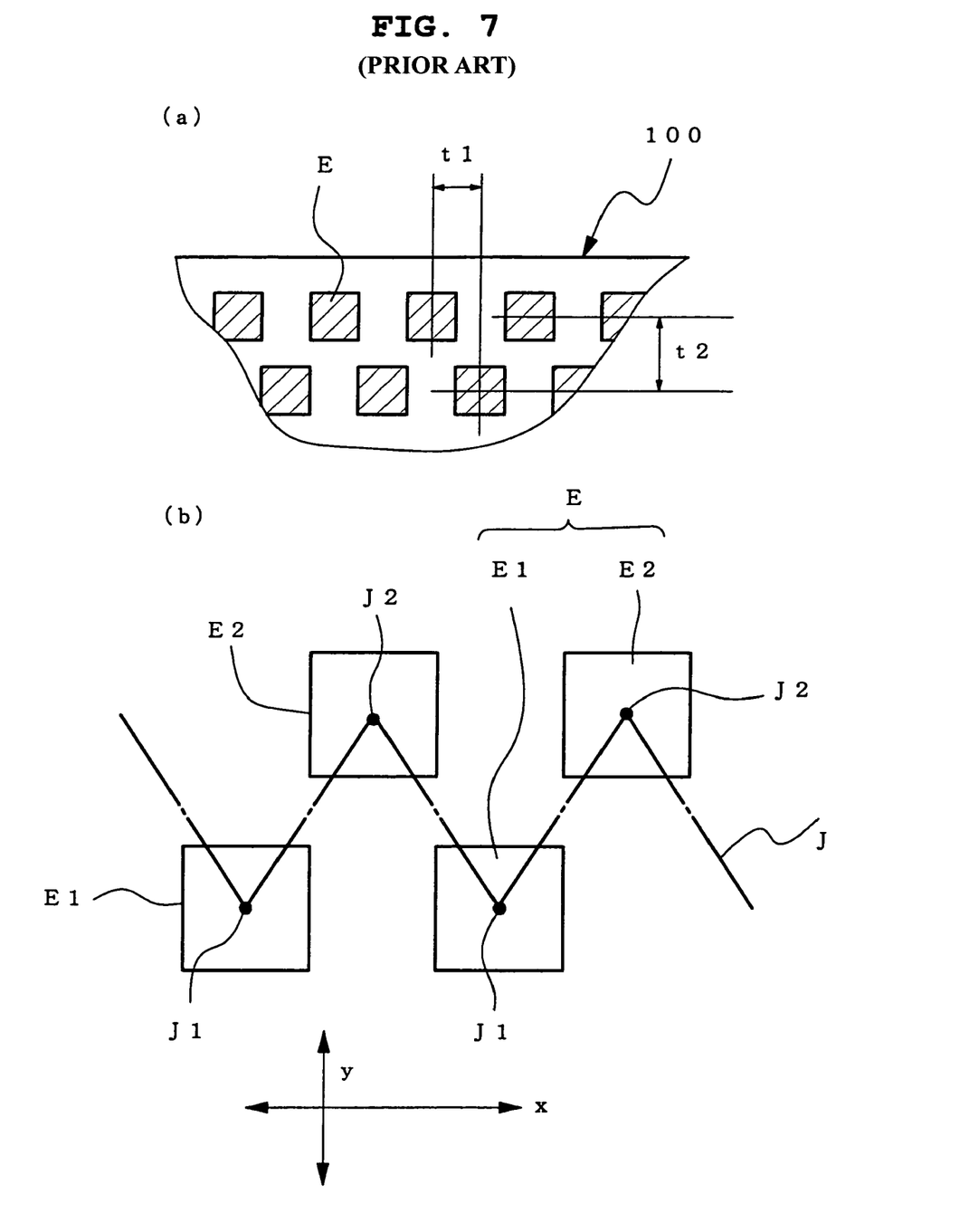
FIG. 7 explains an arrangement pattern of electrodes in the connection surface of a chip.

The electrodes formed on a bare chip are, as shown in FIG. 7, external terminals formed in a zigzag arrangement pattern on an outer periphery of a connection surface of a chip and the outer shape of the individual electrodes E is a quadrate shape (square or rectangle). While the size of one side of individual electrodes (W4 in FIG. 3) is not limited, in a high-density arrangement wherein said wiring circuit board is useful, it is generally about 15 μm–100 μm for one side.

The pitch t1 of the electrodes arranged in high-density as shown in FIG. 7 is about 20 μm–100 μm, particularly about 30 μm–100 μm, more particularly about 30 μm–60 μm, and the amplitude t2 of the zigzag arrangement pattern is generally about 50 μm–200 μm.

Where necessary, individual electrodes have a bump or a flat pad by gold plating and the like.

While the materials and thickness of the insulating substrate to be the base for forming a conductor pattern varies depending on the embodiment of said wiring circuit board, the materials of the insulating substrate include, for example, polyimide resin, polyester resin, epoxy resin, urethane resin, polystyrene resin, polyethylene resin, polyamide resin, acrylonitrile-butadiene-styrene (ABS) copolymer resin, polycarbonate resin, silicone resin, fluorine resin and the like, and the thickness is about 10 μm–100 μm.

As shown in FIG. 1, the strip width and pitch (distance between centers) of each strip conductor formed to constitute a stripe pattern vary depending on the size and pitch of the electrodes to be the connection object. In the case of the size of the above-mentioned electrodes, a useful strip width W2 of an strip conductor is generally about 5 μm–70 μm, particularly 10 μm–30 μm, and a useful pitch P1 is generally 20 μm–100 μm, particularly 30 μm–100 μm, more particularly 30 μm–60 μm.

Note that the strip width W2 of an end adjacent to part (A) and the strip width W3 on the base side (see FIG. 1) may be the same or different.

The specific values of the strip width and pitch of strip conductor relative to electrodes may follow those of conventional art.

The material, constitution of single layer and multiple layers, and a method of forming a pattern of a strip conductor may follow those of conventional wiring circuit boards.

In which direction a stripe pattern ends may be the following (i) and/or (ii) according to the structure of said wiring circuit board.

(i) an embodiment wherein, when a chip is mounted, a pattern of a strip conductor is formed on the outside of the area occupied by said chip, the end enters said occupied area and the pattern ends facing the inside of the area (center).

(ii) an embodiment wherein, when a chip is mounted, a pattern of a strip conductor is formed in the center of the area occupied by said chip, the strip conductor ends at the periphery of the occupied area facing toward the outside of the occupied area.

One example of the basic material constitution of a wiring circuit board is shown in FIG. 2, wherein a pattern of a strip conductor 2 made of copper is formed on a film substrate 1 made of polyimide, and said strip conductor on an end to be connected to electrodes is coated with a connection metal (not shown) such as gold, nickel, tin and the like. In addition, the part other than the whole area where the strip conductor is an end of a stripe pattern is preferably covered with cover lay 4 made of polyimide and the like.

A method of forming a pattern of a strip conductor, which includes topical decrease in the width of the part (A), may be an additive forming method comprising adding a conductor metal to a substrate plane while forming a pattern, or a subtractive forming method comprising forming a uniform conductor metal layer on a substrate plane and removing an area other than the necessary pattern.

Figure 3:
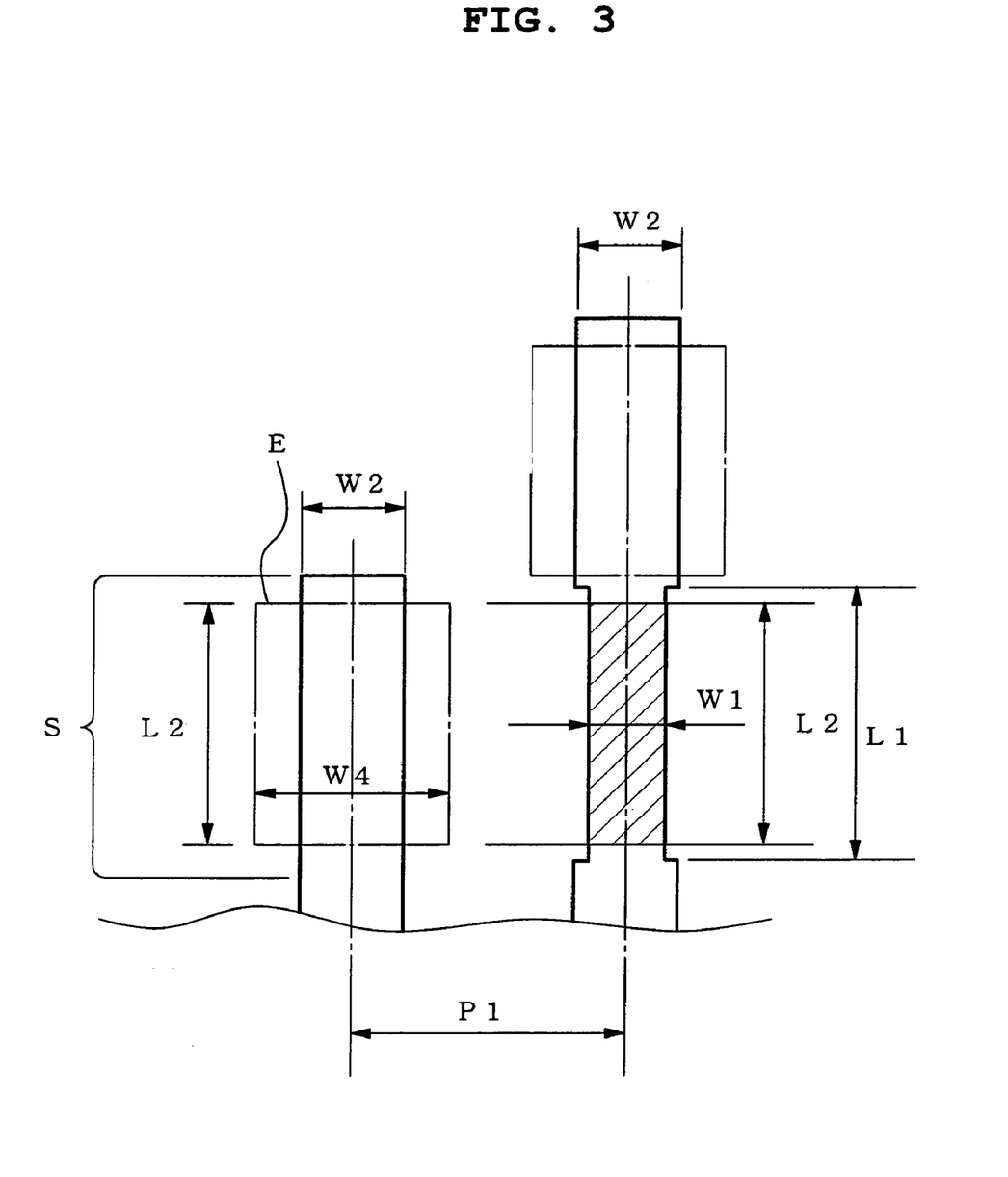
FIG. 3 explains (A) in the present invention.

FIG. 3 is a schematic view showing the size and position of part (A), wherein part (A) of strip conductors having long end is hatched.

The term "including" in the definition of the above-mentioned (A), "comprises an area overlapping an electrode which is connected to a short end and transferred in parallel in the strip width direction up to the position on said strip conductor having a long end" also means being the same.

As shown in FIG. 3, the size L1 of part (A) in the longitudinal direction (direction of extension of strip conductor) is determined according to the size L2 of the electrodes E in the longitudinal direction, which is connected to a short end S, wherein L1≧L2. To certainly suppress a short circuit, L1>L2 is preferable. FIG. 3 shows an embodiment herein L1>L2.

In addition, as shown in FIG. 3, the position of part (A) is such a position corresponding to electrode E, when the electrodes E is connected to the adjacent short end S and the electrodes are slid in the strip width direction of a strip conductor. As a result, a short circuit is effectively suppressed.

In consideration of inconsistent positioning during chip mounting, manufacture error in the size of electrode, production error in the size of part (A) in the longitudinal direction, the size of conductive particles in an anisotropic conductive adhesive and the like, the size L1 of part (A) in the longitudinal direction is preferably designed to be greater than L2 only by 0.1 μm–100 μm, particularly 20 μm–50 μm.

The center of part (A) may be any as long as it is a position where the center of electrodes E to be connected to the adjacent short end S is slid to the strip conductor in the width direction. Alternatively, it may have an error within the range free of adverse influence on other electrodes and permitting achievement of the object of the present invention.

As shown in FIG. 3, the width W1 of part (A) may be decreased to a value that resists short circuit with an electrode and ensures function as a conductive path of a strip conductor, in consideration of the original width W2 of the strip conductor, pitch P1, the width W4 of an electrode (size in the same direction with the width of strip conductor), deviation value during mounting and the like.

For example, as exemplarily shown in the above, when the size W4 of an electrode in the width direction is about 15 μm–100 μm, and the strip conductor has a strip width of about 5 μm–70 μm and a pitch of about 20 μm–100 μm, the proportion of the width W1 part (A) relative to the original strip width W2 is 20%–95%, particularly preferably 40%–80%.

As mentioned above, in the embodiment of FIG. 1, the entire part (A) has the same width and the width is made smaller to form a step at the boundary between the part (A) and the adjacent part.

This embodiment is advantageous in that the length L1 of part (A) can be easily designed to be the shortest relative to an electrode having a quadrate shape, which in turn prevents easy occurrence of peeling of the strip conductor.

Figure 4:
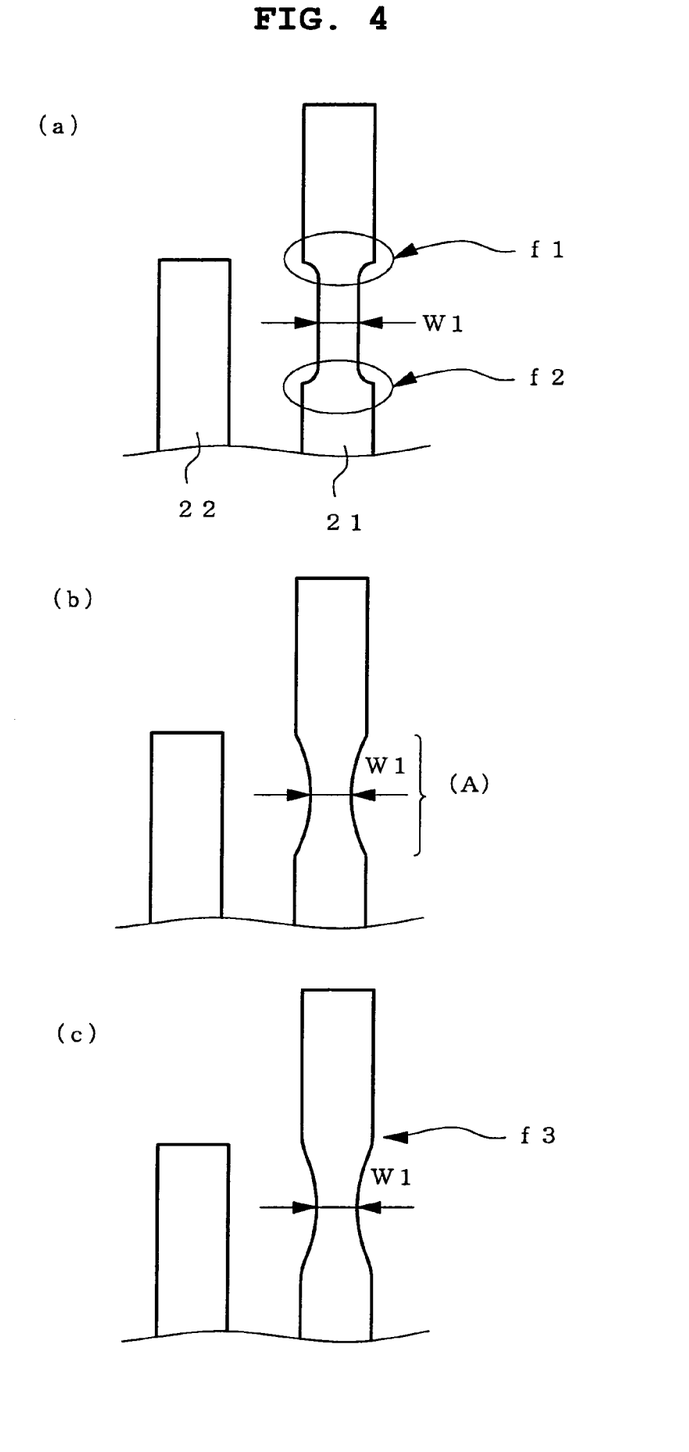
FIG. 4 is a schematic showing of another embodiment of the wiring circuit board of the present invention.

In the embodiment of FIG. 4, moreover, part (A) has a width gradually decreasing from both ends toward the center.

In FIG. 4(a), at boundaries f1 and f2 between the adjacent part and the strip conductor, outlines of side edges form circular arcs to have a strikingly smaller strip width, thus shifting into a parallel strip part in the center having a width W1.

In FIG. 4(b), outlines of side edges of part (A) form greatly incurved circular arcs such that the strip width becomes the smallest at the center.

In FIG. 4(c), a corner f3 is chambered in the embodiment of FIG. 4(b), so that the linear outline of a side edge of a strip conductor and the outline of a side edge in a circular arc of part (A) can be smoothly connected on the corner of these two.

These embodiments shown in FIGS. 4(a)–(c) are not associated with easy incidence of peeling of a strip conductor due to the concentration of the stress since the outline of a side edge includes a circular arc.

EXAMPLE

In this Example, the wiring circuit board of the embodiment shown in FIG. 1 was actually manufactured and evaluated for connection performance with a chip and the like, along with a product of Comparative Example wherein the width of part (A) was not narrowed (=conventional product), and a product of Comparative Example wherein the width of part (A) as well as the full length of a strip conductor for reference.

(Specification of Chip)

The chip to be the connection object is an LSI chip obtained by forming an integrated circuit on a silicon wafer and dicing into elements, which has a thickness of 550 μm and a rectangle having an outer shape of 2 mm×18 mm.

As shown in FIG. 7(a), electrodes E are arranged at high-density on the outer periphery of the connection surface of a chip in an alternate arrangement pattern. The shape of the electrode is a 40 μm×63 μm rectangle longer in the center direction of the connection surface, with Au bumps formed on the surface. The direction of the longer side (63 μm) corresponds to the longitudinal direction of the strip conductor of a wiring circuit board.

The pitch t1 of a zigzag arrangement pattern of electrodes is 40 μm and the amplitude t2 of the zigzag arrangement pattern is 93 μm.

(Formation of Wiring Circuit Board)

A metal thin film is formed on a polyimide film substrate having a thickness of 25 μm by sputtering according to a semiadditive method, and a conductor pattern (pattern total thickness 12 μm) for external connection and a stripe pattern (pattern total thickness 12 μm) involved in the connection area were formed thereon. Then, the area other than the area involved in the connection was entirely covered with a cover lay having a thickness of 10 μm, which was made of polyimide and the like. Then, Ni (lower layer)/Au (upper layer) was formed as a metal coating for connection on each end to be connected to an electrode of a chip by electroless plating.

Figure 5:
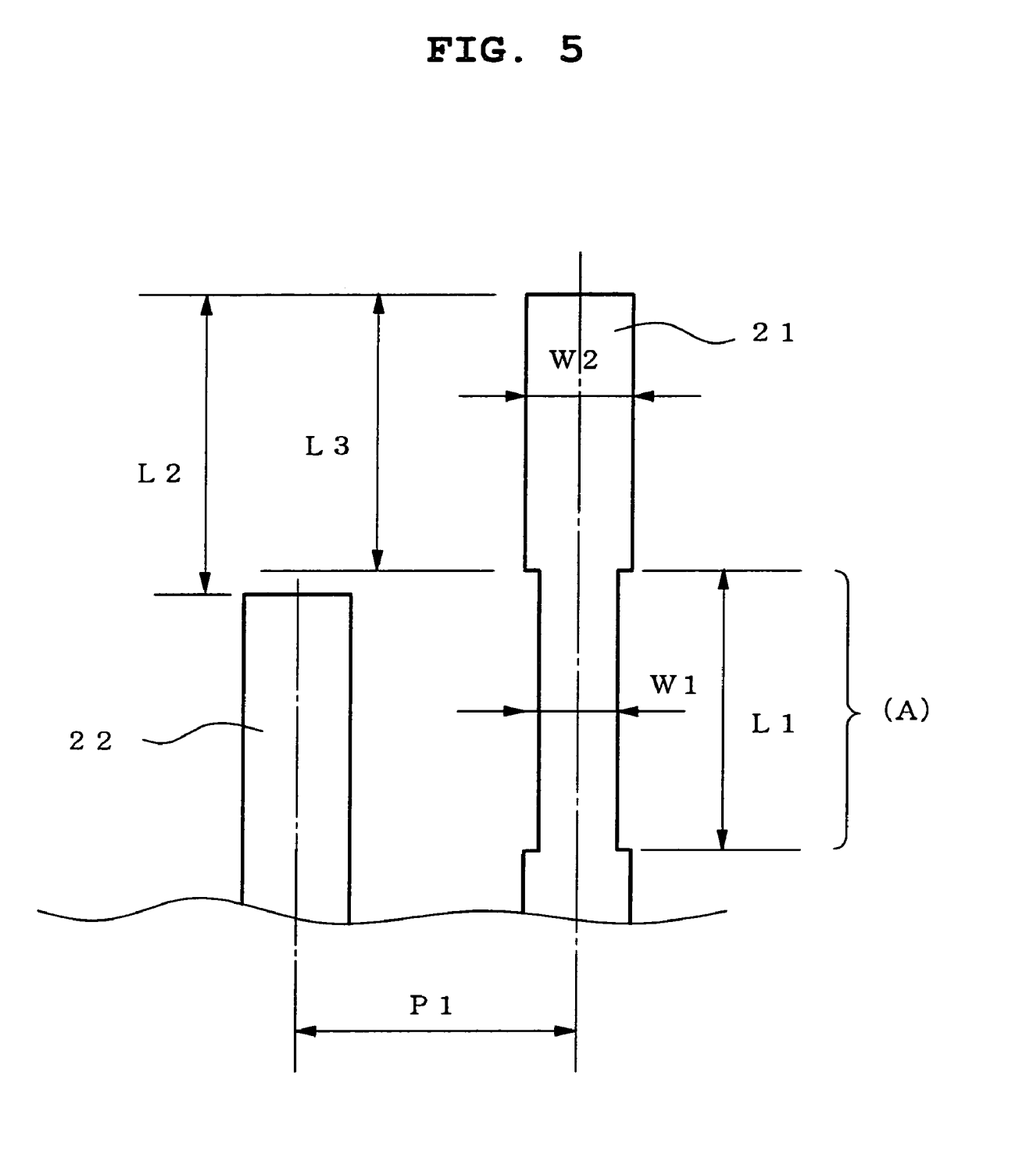
FIG. 5 shows the size of each part of the wiring circuit board manufactured in Example of the present invention.

FIG. 5 shows sizes of respective parts of the stripe pattern of the product of this Example.

A strip conductor 21 having a long end and a strip conductor 22 having a short end both have a basic strip width W2 of 20 μm and a pitch P1 between the centers of strip conductors is 40 μm.

The difference L2 in the lengths between strip conductors 21, 22 is 100 μm. The part (A) of a strip conductor 21 having a long end is a section from a position L3 (=95 μm) from the tip to length L1 (=90 μm) and the width W1 of part (A) is 15 μm.

(Comparative Example 1)

In the same manner as in the above-mentioned Example except that the width of part (A) was not reduced and was the same throughout the entire length as shown in FIG. 8, a wiring circuit board was manufactured and used as a Comparative Example product (i.e., conventional product).

(Comparative Example 2)

In the same manner as in the above-mentioned Example except that the width of the strip conductor was uniformly narrow throughout the entire length, and the width was 15 μm which was the same as width W1 of the part (A) of the above-mentioned Example, a wiring circuit board as in the above-mentioned Example was manufactured at the same pitch and used as a Comparative Example product for reference. This Comparative Example product has the same width throughout the entire length as in Comparative Example 1, but has a narrower width.

(Quality Evaluation of Strip Conductor)

The strip conductors of the wiring circuit board manufactured in the above-mentioned Example, and the wiring circuit boards manufactured in Comparative Examples 1, 2 were observed with an optical microscope and examined for the presence of peeling from the substrate plane. The adhesion/peeling of a polyimide film substrate and a strip conductor was evaluated based on the observation of color shade from the back of the polyimide film substrate through the substrate (transparency), because peeling of the strip conductor causes different color shade as compared to adhered part.

As a result of observation, the wiring circuit boards manufactured in the Examples showed no peeling in any part of a strip conductor containing part (A).

In addition, the wiring circuit board manufactured in Comparative Example 1 was free of peeling, because it did not have a narrow part in any part of the strip conductor, as in conventional products.

However, in the wiring circuit board manufactured in Comparative Example 2, the strip conductor as seen from the back of the polyimide substrate showed different color shade between the middle portion corresponding to the tip thereof and the middle portion corresponding to part (A) because the width of the strip conductor is narrower in the entire length, thus confirming incidence of peeling.

From the foregoing, it has been found that the embodiment of the present invention, wherein a particular section of part (A) alone is topically narrow, resists peeling.

(Mount Evaluation)

The wiring circuit boards manufactured in Example and Comparative Examples 1, 2 were prepared (100 each). A chip was mounted for each and deviation of a chip in the width direction relative to the strip conductor, and incidence of short circuit failure between electrode and adjacent strip conductor were examined.

Figure 6:
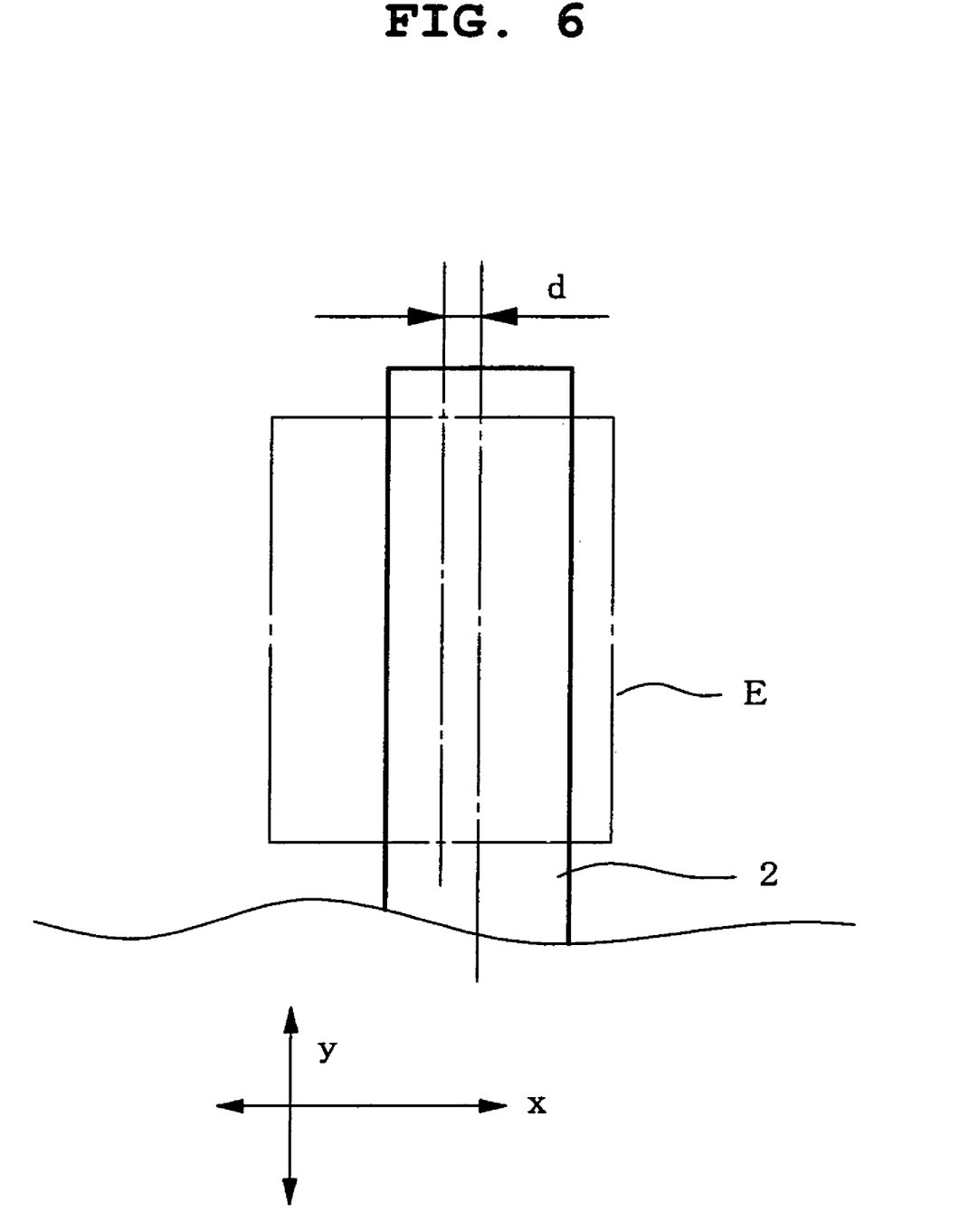
FIG. 6 explains a deviation value in the width direction of a chip relative to a strip conductor in chip mounting.

The deviation of a chip in the width direction relative to the strip conductor means, as shown in FIG. 6, a difference d in the x-direction between the center of the width of strip conductor 2 and the width of electrodes E (size of strip conductor in the same direction as the width), which is mainly a positioning error but also contains small positional errors in patterning and manufacture of electrode itself.

For mounting, an anisotropic conductive film (Hitachi Chemical Co., Ltd., thickness 40 μm, containing conductive particles having an average particle diameter of 3–5 μm dispersed in the film) was located between the chip and the wiring circuit board.

As a mounting apparatus, a flip chip bonder (FB30T, Kyushu Matsushita Electric Co., Ltd., 2002 model) was used, and a bonding tool temperature was set to 280° C. (set value), bonding time was set to 15 sec, bonding load per chip was set to 30 kgf and stage temperature was set to 60° C.

When a chip having the above-mentioned shape and size is mounted using the above-mentioned flip chip bonder by conventional technique, a deviation value of 2 μm means almost no deviation and the positioning on mounting can be evaluated to be extremely fine, a deviation value of 5 μm means slight deviation but less incidence of short circuit failure, and a deviation value 8 μm means certain occurrence of deviation and high possibility of incidence of short circuit failure.

From the mounted samples, those having a deviation value of 2 μm, 5 μm or 8 μm were selected, and the presence of a short circuit failure was confirmed. As a result, the relationship between the deviation value and the incidence of short circuit failure was as shown in the following Table 1.

TABLE 1

| | Characteristics of strip conductor | Deviation value (μm) and incidence (%) of short circuit | | |
|---|---|---|---|---|
| | | 2 μm | 5 μm | 8 μm |
| Example | part (A) is narrow | 0% | 0% | 0% |
| Comparative Example 1 | free of narrow part | 0% | 30% | 80% |
| Comparative Example 2 | narrow in entirety | 0% | 0% | 0% |

As is clear from the results shown in Table 1, it was found that the wiring circuit board of Comparative Example 1 having a conventional structure suffered from occurrence of a short circuit failure in 30% at 5 μm deviation value, but Example product was free of a short circuit failure, and even at a deviation value of 8 μm, the Example product was free of a short circuit failure.

It was found that the wiring circuit board of comparative Example 2 was free of a short circuit failure because the entire strip conductor was narrow, but as mentioned above, each part of the conductor showed peeling from the substrate plane and, moreover, connection failure occurs in a connection with an electrode via an anisotropic conductive film.

From the foregoing explanation, the use of a wiring circuit board of the present invention resulted in the suppression of short circuit failure even in the case of a chip equipped with electrodes formed in a fine pitch, high-density and a zigzag arrangement pattern.

This application is based on patent application No. 2003-418161 filed in Japan, the contents of which are hereby incorporated by reference.

What is claimed is:

1. A wiring circuit board for mounting a bare chip of an integrated circuit by directly connecting electrodes of the bare chip to the wiring circuit, which is characterized in that
   the bare chip to be mounted comprises plural electrodes formed on a connection surface thereof in an alternate arrangement pattern following zigzag peaks, the outer shape of the individual electrodes is a quadrate shape of about 15 μm–100 μm for one side;
   the wiring circuit board comprises a strip conductor formed in exposure and extending in a direction about perpendicular to an advancing direction of said zigzag, in a stripe pattern, so that an individual conductor can be directly connected to each electrode of the bare chip;
   each strip conductor forms an end at a position corresponding to each electrode, thus the ends of the stripe pattern being formed by alternately arranged long ends and short ends; and
   the strip conductor having a long end part comprises the following part (A) having a smaller width than the width of parts adjacent to both ends of the part (A):
   (A) one section in the longitudinal direction of a strip conductor having a long end, which section comprises an area overlapping an electrode which is connected to a short end and transferred in parallel in the strip width direction up to the position on said strip conductor having a long end, and which section is greater than the area by 0.1 μm–100 μm in the longitudinal direction.

2. The wiring circuit board of claim 1, wherein said part (A) has the same width for the whole and the width becomes smaller at the boundary between the part (A) and the adjacent part to form a step.

3. The wiring circuit board of claim 1, wherein said part (A) comprises a part having a gradually decreasing width from both ends toward the center.

4. The wiring circuit board of claim 3, wherein said part (A) has a width gradually decreasing from both ends toward the center where it becomes the smallest, such that outline(s) of side edge(s) form(s) an incurved circular arc.

5. The wiring circuit board of claim 1, wherein the bare chip to be mounted is a bare chip of a semiconductor element having a quadrate shape, and electrodes are formed in an alternate arrangement pattern following zigzag peaks on the outer periphery area of a connection surface of said bare chip.

6. The wiring circuit board of claim 5, wherein, when a bare chip is mounted on the wiring circuit board, a strip conductor pattern is formed on the outside of an area occupied by said bare chip, and an end of each strip conductor enters said occupied area and ends facing the center of said occupied area.

7. The wiring circuit board of claim 5, wherein, when a bare chip is mounted on said wiring circuit board, a strip conductor pattern is formed in the center of an area occupied by said bare chip, and each strip conductor ends at the periphery of said occupied area facing toward the outside of the area.

8. The wiring circuit board of claim 1, wherein each strip conductor formed to make a stripe pattern has a strip width of 5 μm–70 μm and a pitch of 20 μm–100 μm.

* * * * *